(12) United States Patent
Murase et al.

(10) Patent No.: US 6,663,253 B2
(45) Date of Patent: Dec. 16, 2003

(54) MOLDED OPTICAL PANEL AND MOLD THEREFORE

(75) Inventors: Shinzo Murase, Shiga-ken (JP); Kenzo Murata, Osaka (JP)

(73) Assignees: Stanley Electric Company, Limited, Tokyo (JP); Sumitomo Chemical Company, Limited, Osaka-fu (JP)

( * ) Notice: Subject to any disclaimer, the term of this patent is extended or adjusted under 35 U.S.C. 154(b) by 0 days.

(21) Appl. No.: 09/812,851

(22) Filed: Mar. 21, 2001

(65) Prior Publication Data

US 2001/0048594 A1 Dec. 6, 2001

(30) Foreign Application Priority Data

Mar. 22, 2000 (JP) ........................................ 2000-079673
Mar. 19, 2001 (JP) ........................................ 2001-079039

(51) Int. Cl.$^7$ ................................................. F21V 7/04
(52) U.S. Cl. ......................................... 362/31; 362/551
(58) Field of Search ................................ 385/146, 901; 264/219, 496, 494; 362/31, 330, 358, 558, 551

(56) References Cited

U.S. PATENT DOCUMENTS 5,776,636 A * 7/1998 Kunisawa et al. ............. 430/5
5,961,198 A * 10/1999 Hira et al. .................... 349/65

* cited by examiner

Primary Examiner—Sandra O'Shea
Assistant Examiner—Guiyoung Lee

(57) ABSTRACT

A photosensitive polyimide resin 12 is exposed and developed via a computer-aided designed (CAD) pattern film 14 to form a pattern onto a mold base 11 by means of photoresisit method. A molded pattern 13 is thus formed to construct a mold 10. An optical panel 2 is formed by the use of the mold 10 with an optical pattern 3 comprising circular or rectangular dot holes or dot projections each of which is several μms and arranged in high density which is a reversal of the molded pattern 13. The optical pattern 3 performs light guiding or diffusion of incident light in high luminance and with a high degree of uniformity, thereby achieving secondary illumination without having see-through of the optical pattern.

30 Claims, 4 Drawing Sheets

MOLDED OPTICAL PANEL AND MOLD THEREFORE

BACKGROUND OF THE INVENTION

1. Field of the Invention

This invention relates to a molded optical panel for use in, such as, for example, a back light or front light panel of liquid crystal display, an edge light panel of various kinds of face illuminators and illumination boards, and a light diffusing panel and a mold for forming the optical panel.

2. Description of the Related Art

In Applicants' co-pending Japanese Patent Application Hei 11(1999)-267686, there is proposed an optical panel for use in an edge light panel on one face of which is formed integrally a light guiding pattern by making use of a mold provided with a mold base and a molded pattern formed indirectly on the mold base by charging a heat-resistant resin forming a light guiding element into a porous pattern film obtained by exposing and developing a negative-type photosensitive resin by a photoresist method.

The co-pending Japanese application has advantages in that it is possible to produce a mold relatively easily for an extremely short amount of time, namely, half a day to a day, as compared with the conventional method of making the mold by an electrical discharging process, etching process and the like which requires a working time of several days to one week. Accordingly, it becomes possible to respond properly to requests for short-run productions and deliveries of a small amount of various types of flat panel illuminators such as the optical panel for edge light panel or liquid crystal backlights. Further, the co-pending application has advantages of making it possible to form the light guiding pattern of higher precision and higher density as compared with the optical panel for the edge light panel molded by using the conventional mold, and to obtain the optical panel for the edge light panel exhibiting high luminance and high uniformity while preventing the see-through pattern.

However, since the molded pattern is formed indirectly of heat-resistant resin by the use of a negative-type photosensitive resin, it is necessary to supply the heat-resistant resin forming the light guiding element to a porous pattern film via a screen mesh and the like after forming the porous pattern film of the negative-type photosensitive resin. Accordingly, the co-pending Japanese application has disadvantages in that a process for producing the mold is still complicated and precise charging of the heat-resistant resin into the porous pattern becomes gradually difficult due to inclusion of air and the like. As the light guiding element comprising a dot or a line or the like is minute, there is a tendency of creating a failure in the molded pattern resulting from insufficient charging of the heat-resistant resin.

Accordingly, a first problem to be solved by this invention is to propose a molded optical panel having high luminance and high uniformity or a molded optical panel having excellent light diffusing properties, either type of panel being suitable for short-run production and delivery in small numbers by facilitating the production of the mold and shortening the working time. A second problem to be solved by this invention is to propose the mold used for molding these optical panels.

The present inventor has been developed to address the first and second problems as described above, wherein the following facts were determined:

(1) Since the molded pattern can be formed directly on the mold base by a photosensitive heat-resistant resin, wherein the molded pattern is formed on the mold base using a photoresist method via the pattern film by making use of the photosensitive heat-resistant resin, the problems resulting from charging of the heat-resistant resin when the molded pattern is formed indirectly can be solved. Moreover, it is possible to simplify the process of the production of the mold and shorten the working time.

(2) When the molded pattern is formed by making use of the photoresist method using, for example, a pattern designed by CAD as a positive or negative pattern film depending on an application of the optical panel, the molded pattern corresponding to the designed pattern can be reproduced exactly. Accordingly, the optical pattern as a reversal pattern of the molded pattern can be obtained. The optical pattern thus formed exhibits a high luminance and high uniformity corresponding exactly to the designed pattern.

(3) Further, direct formation of the molded pattern by the photoresist method permits forming a suitable molded pattern which is capable of controlling light. For example, the molded pattern having a wide range of density can be formed with example, the molded pattern having a wide range of density can be formed with extremely high degree of precision covering from the conventional limit of density of approximately 25 lines to 50 lines per inch (25.4 mm) in terms of line density, namely, 0.5 mm to 1 mm in terms of space between each of two pattern elements to fine pattern of maximum high density and still performing guide of incident light effectively, for example, high density of 0.05 mm or less in terms of space. The molded pattern is reversed to obtain the corresponding light guiding pattern.

(4) By maximizing the space between each of two pattern elements, the optical pattern of fine precision and high density corresponding to the reversed pattern of the molded pattern can be formed. Accordingly, the optical panel for an edge light panel of high performance exhibiting a high luminance and high degree of uniformity and eliminating the pattern see-through can be obtained.

(5) Further, it is possible to apply the optical panel of the present invention to the light diffusing panel which diffuses light from a light emitting apparatus, such as, a backlight panel of liquid crystal display, placed immediately below the light diffusing panel and to utilize diffused light so as to illuminate uniformly through the light diffusing panel. A fine pattern and high density of the optical pattern can be formed on the light diffusing panel to obtain a high degree of uniformity of the light diffusing panel.

SUMMARY OF THE INVENTION

According to one aspect of this invention, there is provided an optical panel at least on one surface of which is formed integrally an optical pattern. The optical pattern is directly formed by making use of a mold and a molded pattern of a photosensitive heat-resistant resin formed by the use of a photoresist method via a pattern film. The photoresistant resin is a positive type and the pattern film is a optical pattern elements. In an alternative form of the present invention, the film, thereby the optical pattern is formed as a concave pattern having photosensitive heat-resistant resin is a positive type and the pattern film is a negative film, thereby the optical pattern is formed as a projected pattern having projected optical pattern elements. The photosensitive heat-resistant resin may be negative type and the pattern film may be a positive film, thereby the optical pattern is formed as a projected pattern having projected optical pattern elements. Further, the photosensitive resin may be negative type and the pattern film may be a negative film, thereby the optical pattern is formed as a concave pattern having concave pattern elements. The optical pattern includes the optical pattern elements each of which is more than 1 μm and less than 300 μm in diameter or side length having space of more than 5 μm and less than 1 mm between each two optical pattern elements. The optical pattern acts as a light guiding pattern and is formed by changing non-stepwise diameter and/or density of the optical pattern element comprising dots or lines so as to perform light guiding inversely proportional to an amount of incident light from a light incident edge face of the optical panel toward a position distant from the light incident edge face to perform light guiding control. The optical panel of the present invention can be used for a light diffusing panel using the optical pattern as a light diffusing pattern. The photoresist method used herein implies a method used for semiconductors or other similar device and is defined as a method in which a photoresist film is formed on a mold base, exposed to light and developed to transfer a pattern from pattern film used in the light exposure.

The molded optical panel of the present invention can simplify the production of the mold, and shorten significantly the working time to approximately a few hours, and can be adapted properly to the short-run production and delivery of a small amount of various kinds of the optical panels, such as, the edge light panels and the light diffusing panel. Further, the molded optical panel of the present invention can form the optical pattern corresponding exactly to the designed pattern, and ensure brightness and uniformity of the optical panel as designed, which results in performing the secondary illumination. Furthermore, the molded optical panel of the present invention can provide the fine optical pattern exhibiting high performance, utmost high fine precision and high density without see-through of the pattern. In addition, the molded optical panel of the present inventions can provide the preferable shape of the optical pattern, and makes the light guiding of, for example, an edge light panel high luminance and high uniformity either by forming the optical pattern high density or by controlling the light guiding of incident light in the direction distant from the light source. The same result can be obtained when the optical panel is used as a light diffusing panel.

According to another aspect of this invention, there is provided a mold for forming the optical pattern integrally at least on one surface of the optical panel. The mold comprises a mold base and a molded pattern of a photosensitive heat-resistant resin formed directly on the mold base by the use of a photoresist method via a pattern film. The photosensitive heat-resistant resin used in the mold is preferably a photosensitive polyimide resin.

The mold for a molded optical panel of the present invention can simplify the production of the mold, and significantly shorten the working time to a few hours, and can be adapted properly to the short-run production and delivery of a small amount of various kinds of the optical panels. Further, the mold for the molded optical panel of the present invention can form the molded pattern on the mold base corresponding exactly to the designed pattern having high adhesion to the mold base. Furthermore, the mold for the molded optical panel of the present invention can provide the mold having a high precision and durability for use in forming the optical pattern of the edge light panel or light diffusing pane. In the mold of the present invention, it is preferably to use a photosensitive heat-resistant resin which makes the direct production of the molded pattern by the photoresist method easy and can provide the mold having excellent transference at the time of molding of the optical panel.

BRIEF DESCRIPTION OF THE DRAWINGS

A more complete understanding of this invention may be obtained through the following detailed explanations in connection with the accompanying drawings, in which.

DETAILED DESCRIPTION OF THE PREFERRED EMBODIMENTS

Figure 1:
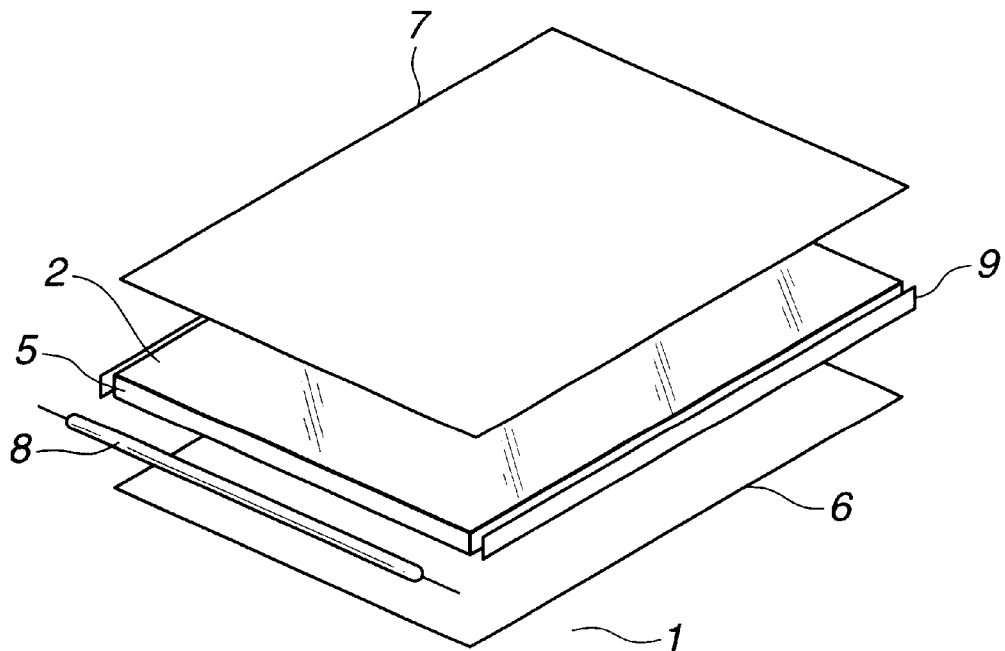
FIG. 1 is an exploded perspective view showing a flat panel light source.

Referring now to an embodiment of the present invention shown in FIG. 1, there is shown a face illuminator 1 used for a back light of liquid crystal display. The face illuminator 1 comprises a molded edge light panel 2 having one surface that is formed integrally with an optical pattern 3, a reflector 6 placed on a back surface of molded edge light panel 2, and a light diffusing element placed on the light the a light source 8 of a linear light source, such as, for example, a cold cathode emitting surface of the molded edge light panel 2. The face illuminator 1 is provided fluorescent tube, located adjacently to a light incident edge face 5 of the mold edge light panel 2. The face illuminator 1 guides incident light supplied from the light source 8 to the light incident edge face 5 so as to illuminate secondarily the whole surface area of the edge light panel by means of the light guiding pattern 3.

Figure 2:
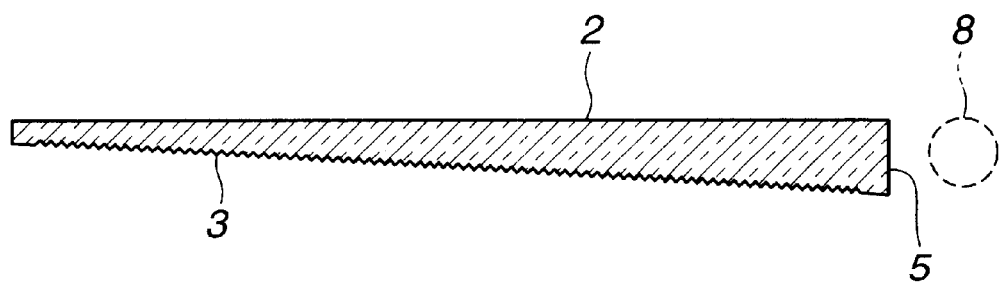
FIG. 2 is a longitudinal sectional view showing an edge light panel.
Figure 3:
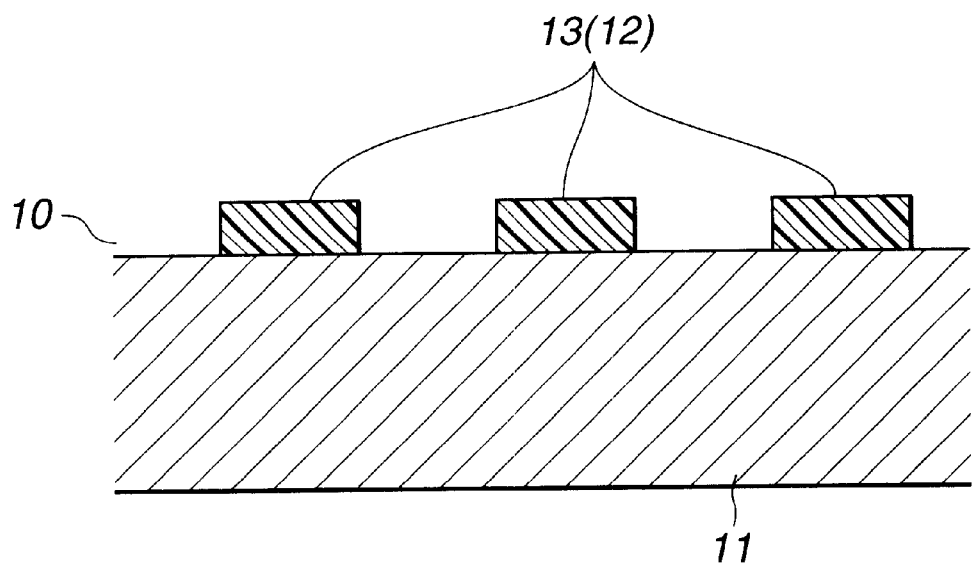
FIG. 3 is a longitudinal sectional view showing a molded pattern in a mold.

The molded edge light panel 2 is a transparent, thin, flat, and wedge-shaped plate having a tapered back face as shown in FIG. 2. The edge light panel is formed of a transparent synthetic resin of high light transmission, such as, for example, acrylic resin, polycarbonate resin and the like by an injection molding. One edge face of the molded edge light panel 2 is provided with the light incident edge face 5 adjacent to the light source 8. The molded edge light panel 2 is used to be projected by the light source from one side of the edge light panel 2.

Figure 4:
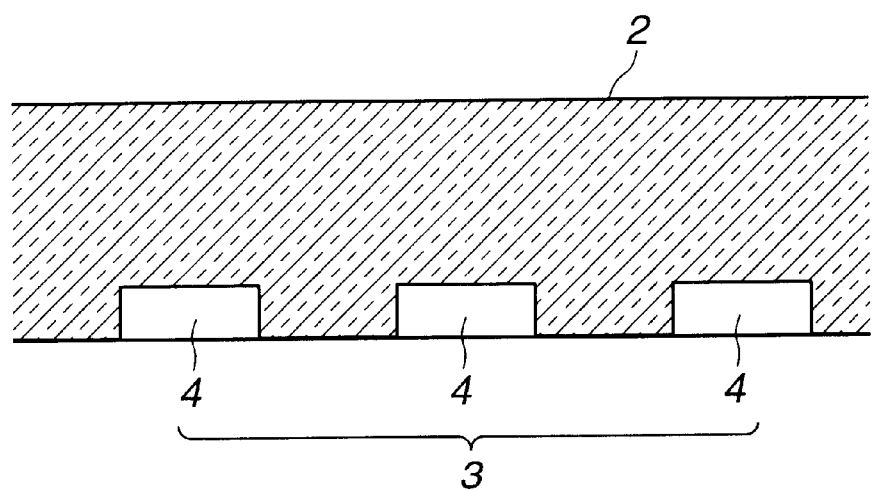
FIG. 4 is a longitudinal sectional view showing an optical pattern of the molded edge light panel.

The optical pattern 3 on the molded edge light panel 2 is formed by a mold 10 provided with a mold base 11 and a molded pattern 13 made of a photosensitive heat-resistant resin 12. The molded pattern 13 is formed directly on the mold base 11 by a photoresist method via a pattern film 14. The photosensitive heat-resistant resin 12 is of a positive type, while the pattern film 14 is a positive film, whereby the optical pattern in the shape of dots or lines is formed. FIG. 4 shows the concave pattern having concave dot shaped optical pattern elements 4. The optical pattern 3 formed by changing non-stepwise density of the dot-shaped or line-shaped optical pattern elements 4 so as to perform light guiding inversely proportional to an amount of incident light from the edge face 5 supplying the incident light toward a position distant from the light incident edge face 5 to perform the control of light. The optical pattern 3 is formed of a high density array of dots or liens changing non-stepwise to have the dot space of more than 0.05 mm and less than 0.4 mm, preferably 0.08 mm to 0.25 mm, namely, in the range of more than 60 lines and less than 500 lines per inch, preferably in the range from 100 to 300 lines per inch in terms of the line density. The dot shaped optical pattern element 4 is formed in a depth of less than 30 $\mu$m and with a diameter of less than 50 $\mu$m, preferably from about 10 to 30 $\mu$m to form a porous fine pattern having high density and the utmost fine precision. Further, the diameter of the dot shaped optical pattern 4 is configured to be non-stepwise increased gradually so that the light incident edge face 5 becomes the changing point of the start. An edge face for reflection opposite to the light incident edge face 5 or a position close thereto becomes the changing point of the peak in order to perform uniform light guiding control of the edge light panel illuminated by the light source from the one side of the edge light panel. As a result, secondary illumination of extremely high luminence and high uniformity can be realized by means of the optical pattern.

The mold 10 for integrally forming the optical pattern 3 on the face of the molded edge light panel 2 comprises the mold base 11 and the molded pattern 13 of the positive-type photosensitive heat-resistant resin 12 formed on the mold base 11 via the pattern film 14 by photoresist method. The mold base 11 is made of a stainless steel plate approximately 0.1 to 5 mm thick. It is preferable to use the positive-type photosensitive heat-resistant resin 12 having high resolution by exposure to light and development, and high adhesion by printing used for production of a semiconductor, particularly a protective coat film on a semiconductor wafer and an insulation film layer. By virtue of the high resolution of the photosensitive heat-resistant resin, the fine molded pattern 13 having fine projections of high precision and high density can be formed directly on the mold base 11. Furthermore, by virtue of the high adhesion of the photosensitive heat-resistant resin, partial flaking or peeling of the molded pattern 13 from the mold 10 can be prevented, and a large number of molded edge light panel 2 can be produced continuously from the mold 10.

The positive-type photosensitive heat-resistant resin 12 is selected from positive-type photosensitive polyimide resins. Polyimide resin used in this embodiment is, SUMIRESIN EXCEL CRC-8000 series (for example, CRC-8300) generally known as a semiconductor coating material manufactured by Sumitomo Bakelite Co., Ltd. This polyimide resin makes it possible easily and reliably to form the molded pattern 13 directly on the mold base 11 by the photoresist method as well as the mold 10 for producing the edge light panel 2.

The formation of the molded pattern 13 on the mold base 11 by the use of the positive-type photosensitive heat-resistant resin 12 comprises the steps of coating the mold base 11 with the positive-type photosensitive heat-resistant resin 12 to form the photoresist film on its surface, pre-heating the photoresist film so as to harden slightly, exposing the applied photoresist film to light via the positive-type pattern film 14 for forming the optical pattern 3 (sensitization step), developing the exposed photoresist film, cleansing and removing the portions removed by the development, and baking at high temperature the pattern formed by the development to harden the positive-type photosensitive heat-resistant resin.

Figure 5A:
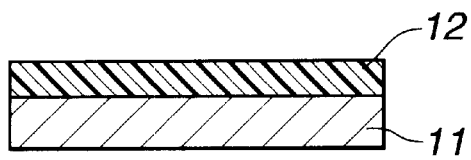
FIG. 5 is a flow chart showing the state of forming a photoresist film on a mold base.
Figure 5B:
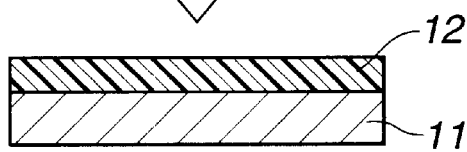
Figure 5C:
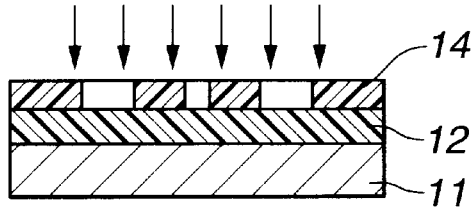
Figure 5D:
Figure 5E:
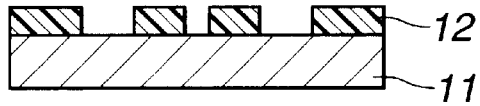
Figure 5F:
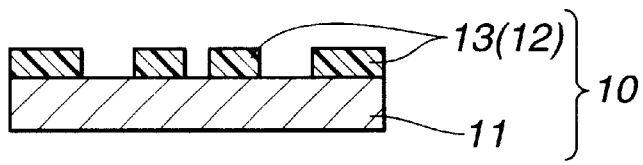

FIG. 5(A) shows the state of coating the mold base 11 with the positive-type photosensitive heat-resistant resin 12 in the coating step. FIG. 5(B) shows the state of pre-heating the positive-type photosensitive heat-resistant resin 12 in the pre-baking step. FIG. 5(C) shows the state of exposing the positive-type photosensitive heat-resistant resin 12 to light via the pattern film 14 in the exposure step. FIG. 5(D) shows the state of developing the positive-type photosensitive heat-resistant resin 12 in the developing step and partially dissolving the developed positive-type photosensitive heat-resistant resin. FIG. 5(E) shows the state of cleansing and removing the portions dissolved by development in the cleansing step. FIG. 5(F) shows the molded pattern 13 formed directly on the mold base 11 by the positive-type photosensitive heat-resistant resin 12 hardened in the baking step.

The coating step can be carried out by a coater in which the positive-type photosensitive heat-resistant resin 12 is supplied dropwise or by spray to the surface of the mold base 11 set to the coater. The mold base 11 is rotated at high speed to coat the mold base 11 with the positive-type photosensitive heat-resistant resin 12 depending upon the depth of the optical pattern element 4 to be formed, for example, in uniform thickness of less than approximately 30 $\mu$m, thereby to form the photoresist film.

The pre-baking step can be carried out by heating for several minutes at a temperature of approximately 120° C. in a heating furnace to perform the pre-heating of the photoresist film so that the photoresist film is subjected to be in exposure of high precision and high density in the next exposure step.

The exposure step can be carried out by irradiating the photoresist film for a short time with light of g-line, i-line or light of continuous wave length including g-line and i-line from a light source, for example, a high pressure mercury lamp, via the CAD designed photographic pattern film 14 by an exposing machine. The pattern film 14 is a positive film which performs to control the light projection by the change of the diameter of the optical pattern in the film. The projected portions of the molded pattern 13 are masked by the pattern film 14 and non-masked portions corresponding to the optical pattern 3 are irradiated with light from a light source to expose them.

The developing step can be carried out by a developer in which a resist developing solution of alkali solution is supplied dropwise or by spray. The mold base 11 is rotated at high speed to distribute uniformly the developing solution, and the developing solution is made to penetrate to exposed non-masked portions and to dissolve them.

The cleansing step can be carried out, for example, by supplying pure water by spray to the mold base 11 which is rotating at high speed so that the dissolved portions are rinsed and removed.

The baking step can be carried out by heating in an atmosphere of nitrogen at the temperature of from 300 to 400° C. in a heating furnace so as to harden the pattern formed by the development step and to adhere and be fixed to the mold base 11 for forming the molded pattern 13.

In this manner, the molded fine pattern 13 which is the reversal pattern of the designed pattern can be formed directly on the mold base 11, and high adhesion of the molded pattern 13 to the mold base 11 is ensured, whereby the mold 10 suitable for forming the edge light panel 2 can be obtained.

The formation of the edge light panel 2 by the mold 10 can be carried out by setting the mold 10 to a molding machine and performing molding at the molding temperatures of approximately 200 to 350° C. When molding, the mold 10 is set so that the molded pattern 13 is situated to the backface of the edge light panel 2, and a flat-shaped mold of stainless steel (not shown) may be set to the front side of the edge light panel 2.

Figure 6:
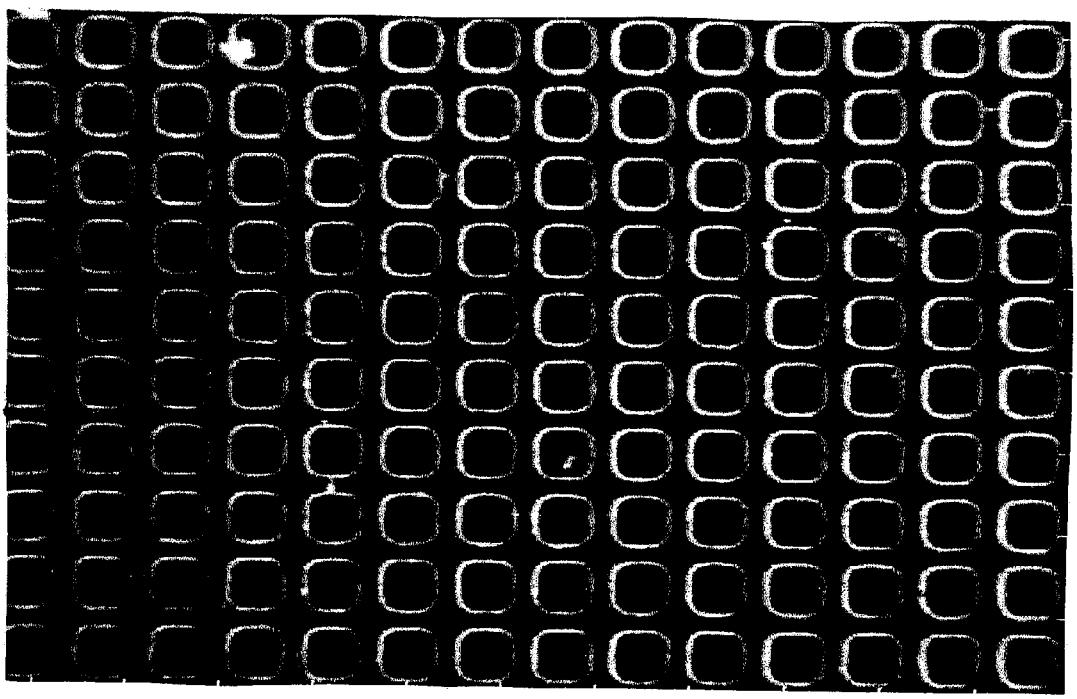
FIG. 6 is a micrograph of 250 magnification of the optical pattern.

FIG. 6 is a micrograph (×250) of the optical pattern 3 of the molded edge light panel 2 molded by the mold 10. The optical pattern 3 includes the light guiding element 4 of the dot holes (bare holes) in the shape of chamfered squares which are arranged systematically in a matrix form and with fine precision and high density.

According to the present invention, the molded pattern 13 of the mold 10 is formed of the photoresist film of high resolution which is prepared by making use of the positive type photosensitive heat-resistant polyimide resin 12. The molded pattern 13 that is formed has a fine pattern of high precision and high density which is formed to the maximum by exposure and development via the positive-type pattern film 14 and which has high adhesion to the mold base 11. In as much as the optical pattern of the present invention is formed by the mold 10 having the molded pattern 13, the optical pattern 3 of the concave fine pattern of high precision and high density which is formed to the maximum and is a reversal of the pattern 13 can be formed integrally to the edge light panel 2. The optical pattern 3 guides incident light and makes the secondary illumination of the edge light panel 2 of the high luminance and with a high degree of uniformity without having a see-through optical pattern.

The liquid crystal back light constructed by making use of the molded edge light panel 2 of the present invention is of high luminance and has a high degree of uniformity, and the optical pattern 3 formed on the molded edge light panel 2 can solve the see-through of the optical pattern 3 to such an extent that it can not be recognized visually on the molded edge light panel 2.

The reflector 6 has a reflective surface of fine low foamed resin which is made of a white sheet of low foamed polyester having high reflective properties. The light diffusing element 7 is made of a white translucent sheet of polyester which diffuses the light in order to suppress a flicker of the light guided in the secondary illumination. Since the see-through of the optical pattern 3 is resolved in the present invention, there is no need to provide diffusing means such as a laminated prism sheet, a sheet material coated with a see-through preventing agent by a post-treatment which are conventionally employed for prevention of the see-through of the optical pattern. Accordingly, the light diffusing element of a single diffusing function can be used.

Since the mold 10 can be produced within an extremely short range of time, for example, approximately one to two hours, the mold 10 suitable for short-run production and delivery thereof for various kinds of the optical panels can be obtained. Further, since the molded pattern 13 can be formed directly onto the mold base 11 by using the positive-type photosensitive heat-resistant resin 12 having the high resolution and high adhesion, the molded pattern 13 can be constructed easily and high yield rate can be ensured at the same time eliminating all possible defective molded pattern 13. In FIG. 9, numeral 1 shows a white reflective tape adhered to the side of the molded edge light panel 2.

Obviously, many modifications and variations of the present invention are possible in the light of the above teachings. For example, when carrying out the control of light by changing non-stepwise the density of the optical pattern, namely, the density of the optical pattern elements, the number of the dot is non-stepwise increased when the light pattern element is the dot, while the width or number of the line is non-stepwise increased when the optical pattern element is the line. The optical pattern element may be arranged in an uniformly spaced dot matrix or in parallel line. The optical pattern element may be arranged randomly. The density may be changed non-stepwise by increasing the number of the optical pattern element, if necessary. Each of the opposite edge faces of the edge light panel may be used as the light incident edge face and is used with both sides having the light source mounted in the proximity of each light incident edge face. When changing non-stepwise the density of the optical pattern element in this instance, the peak position of the incident light is located at the center position of the optical panel, because the incident light is supplied from the light sources arranged at each of opposite edge faces of the edge light panel. The formation of the photoresist film to the mold base may be carried by dipping the mold into the photosensitive heat-resistant resin.

In the embodiment of the present invention, the positive photosensitive heat-resistant resin 12 is used for forming the molded pattern 13 on the mold base 11. It is to be understood that the mold can be manufactured by using the negative photosensitive heat-resistant resin, and the molded edge light panel 2 can be formed by the mold made of the negative photosensitive heat-resistant resin. When the negative photosensitive heat-resistant resin is used, the light exposed area via the pattern film 14 remains as the molded pattern 13 and unexposed area is dissolved and removed by development and cleansing. The negative photosensitive heat-resistance resin is preferably selected from polyimide resins, for example, Hitachi Chemical Dupont Microsystems, Ltd., P1-2732.

Furthermore, the molded optical panel may be formed as an optical panel for use in the light diffusing panel to one surface of which is formed integrally the light diffusing pattern. The light diffusing pattern is formed by the mold provided with molded pattern of the photosensitive heat-resistant resin formed directly on the mold base by the photoresist method via the film pattern. In this instance, the light diffusing panel can be formed by the mold similar to the mold used for the molded edge light panel. Further, it is possible to form the optical pattern on one surface of the optical panel and the light diffusing pattern on the other surface of the optical panel. The optical pattern and the light diffusing pattern are formed by the mold provided with the molded pattern of the photosensitive heat-resistant resin formed directly on the mold base by the photoresist method via the film pattern. The optical panel having the optical pattern and the light diffusing pattern can be formed by placing the molds similar to the mold used in manufacturing the molded edge light panel on both surfaces of the optical panel. The light guiding pattern and the light diffusing pattern are referred to as an optical pattern in the present invention.

It is to be understood that the optical pattern becomes the projected dot-shaped or line shaped optical pattern element when the photosensitive heat-resistant resin is positive type and the pattern film is the negative film. In the same manner, the optical pattern becomes the projected dot-shaped or line shaped optical pattern element when the photosensitive heat-resistant resin is negative type and the pattern film is the positive film. On the other hand, the optical pattern becomes the concave dot-shaped or line shaped optical pattern element when the photosensitive heat-resistant resin is negative type and the pattern film is the negative film. In the embodiment of the present invention, the explanation is made with reference to the optical pattern changing the dot space non-stepwise within the range of more than 0.05 mm and less than 0.4 mm and having the diameter of less than 50 μm. However, it is possible to form finer pattern, because the positive or negative type photosensitive heat-resistant resin is used. For example, the optical pattern element in the shape of circular, rectangular and any other shapes can be formed, and the diameter or the side length can be changed within the range of more than 1 μm and less than 300 μm and space between each two optical pattern element can be changed within the range of more than 5 μm and less than 1 mm. Further, the size and/or the space of the pattern can be freely changed non-stepwise from one end of the optical panel to the other end of the optical panel within this range.

As explained hereinabove, various modifications and variations with respect to the mold, the molded pattern, the optical panel, the optical pattern including the light guiding pattern and the light diffusing pattern, the optical element, the reflector, the light diffusing element, the photosensitive heat-resistant regin, the shape and the size of the molded pattern, the density of the molded pattern, etc. are possible without departing from the sprit of the present invention.

What is claimed is:

1. A molded optical panel, the optical panel having at least one surface on which is integrally formed an optical pattern, said optical pattern is formed by the steps of using a mold having a mold base and forming a molded pattern on the mold base, the molded pattern being formed with a photosensitive heat resistant resin via a photoresist method with a pattern film including a high temperature baking step at the of 300° C. or higher for subjecting said photosensitive heat resin to be thermoset.

2. A molded optical panel as defined in claim 1, wherein said photosensitive heat-resistant resin is a positive type, and said pattern film is a positive film such that said optical pattern is formed as a concave pattern having concave optical pattern elements.

3. A molded optical panel as defined in claim 2, wherein said optical pattern includes said optical pattern elements each of which is more than 1 μm and less than 300 μm in diameter or side length having space of more than 5 μm and less than 1 mm between each two optical pattern elements.

4. A molded optical panel as defined in claim 2, wherein said optical pattern is a light guiding pattern such that said light guiding pattern is for ned by varying non-stepwise a diameter, side length and/or density of the light guiding elements so as to perform light guiding inversely proportional to an amount of incident light from a light incident edge face toward a position distant from said light incident edge face and control light.

5. A molded optical panel as defined in claim 2, wherein said optical panel is a light diffusion panel.

6. A molded optical panel as defined in claim 1, wherein said photosensitive heat-resistant resin is a positive type, and said pattern film is a negative film such that said optical pattern is formed as a projected pattern having projected optical pattern elements.

7. A molded optical panel as defined in claim 6, wherein said optical pattern includes said optical pattern elements each of which is more than 1 μm and less than 300 μm in diameter or side length having space of more than 5 μm and less than 1 mm between each two optical pattern elements.

8. A molded optical panel as defined in claim 6, wherein said optical pattern is a light guiding pattern such that said light guiding pattern is formed by varying non-stepwise a diameter, side length and/or density of the light guiding elements so as to perform light guiding inversely proportional to an amount of incident light from a light incident edge face toward a position distant from said light incident edge face and control light.

9. A molded optical panel as defined in claim 6, wherein said optical panel is a light diffusion panel.

10. A molded optical panel as defined in claim 1, wherein said photosensitive heat-resistant resin is negative type and said pattern film is a positive film such that said optical pattern is formed as a projected pattern having projected pattern elements.

11. A molded optical panel as defined in claim 10, wherein said optical pattern includes said optical pattern elements each of which is more than 1 μm and less than 300 μm in diameter or side length having space of more than 5 μm and less than 1 mm between each two optical pattern elements.

12. A molded optical panel as defined in claim 10, wherein said optical pattern is a light guiding pattern such that said light guiding pattern is formed by varying non-stepwise a diameter, side length and/or density of the light guiding elements so as to perform light guiding inversely proportional to an amount of incident light from a light incident edge face toward a position distant from said light incident edge face and control light.

13. A molded optical panel as defined in claim 10, wherein said optical panel is a light diffusion.

14. A molded optical panel as defined in claim 1, wherein said photosensitive heat-resistant resin is negative type and said pattern film is a negative film such that said optical pattern is formed as a concave pattern having concave optical pattern elements.

15. A molded optical panel as defined in claim 14, wherein said optical pattern includes said optical pattern elements each of which is more than 1 μm and less than 300 μm in diameter or side length having space of more than 5 μm and less than 1 mm between each two optical pattern elements.

16. A molded optical panel as defined in claim 14, wherein said optical pattern is a light guiding pattern such that said light guiding pattern is formed by varying non-stepwise a diameter, side length and/or density of the light guiding elements so as to perform light guiding inversely proportional to an amount of incident light from a light incident edge face toward a position distant from said light incident edge face and control light.

17. A molded optical panel as defined in claim 14, wherein said optical pattern is a light diffusion panel.

18. A molded optical panel as defined in claim 1, wherein said optical pattern includes said optical pattern elements each of which is more than 1 μm and less than 300 μm in diameter or side length having space of more than 5 μm and less than 1 mm between each two optical pattern elements.

19. A molded optical panel as defined in claim 1, wherein said optical pattern is a light guiding pattern such that said light guiding pattern is formed by varying non-stepwise a diameter, side length and/or density of the light guiding elements so as to perform light guiding inversely proportional to an amount of incident light from a light incident edge face toward a position distant from said light incident edge face and control light.

20. A molded optical panel as defined in claim 1, wherein said optical panel is a light diffusion panel.

21. A mold for a molded optical panel for forming an optical pattern integrally at least on one surface of said optical pattern, comprising a mold base and a molded pattern, the molded pattern being formed from a photosensitive heat-resistant resin using a pattern film with a photoresist method via a high temperature baking step at the temperature of 300° C. or higher for subjecting said photosensitive heat resistant resin to be thermoset.

22. A mold for a molded optical panel as defined in claim 21, wherein said photosensitive heat-resistant resin is photosensitive polyimide resin.

23. A method for forming an optical panel having at least one surface on which is integrally formed on an optical pattern, said method comprising the steps of:

providing a mold having a mold base, and forming a molded pattern on the mold base, including forming the molded pattern with a photosensitive heat resistant resin via a photoresist method with a pattern film including a high temperature baking step at the temperature of 300° C. or higher for subjecting said photosensitive heat resistant resin to be thermoset.

24. A method as defined in claim 23, wherein said photosensitive heat-resistant resin is a positive type, and said pattern film is a positive film, the method further comprising the step of forming the optical pattern as a concave pattern having concave optical pattern elements.

25. A method as defined in claim 23, wherein said photosensitive heat-resistant resin is a positive type, and said pattern film is a negative film, the method further comprising the step of forming the optical pattern as a projected pattern having projected optical pattern elements.

26. A method as defined in claim 23, wherein said photosensitive heat-resistant resin is negative type and said pattern film is a positive film, the method further comprising the step of forming the optical pattern as a projected pattern having projected pattern elements.

27. A method as defined in claim 23, wherein said photosensitive heat-resistant resin is negative type and said pattern film is a negative film, the method further comprising the step of forming the optical pattern as a concave pattern having concave optical pattern elements.

28. A method as defined in claim 23, wherein said optical pattern includes said optical pattern elements each of which is more than 1 µm and less than 300 µm in diameter or side length having space of more than 5 µm and less than 1 mm between each two optical pattern elements.

29. A method as defined in claim 23, wherein said optical pattern is a light guiding pattern such that said light guiding pattern is formed by varying non-stepwise a diameter, side length and/or density of the light guiding elements so as to perform light guiding inversely proportional to an amount of incident light from a light incident edge face toward a position distant from said light incident edge face and control light.

30. A method as defined in claim 23, wherein said optical panel is a light diffusion panel.

* * * * *